US010252906B2

(12) United States Patent
Brioschi et al.

(10) Patent No.: US 10,252,906 B2
(45) Date of Patent: Apr. 9, 2019

(54) PACKAGE FOR MEMS DEVICE AND PROCESS

(71) Applicant: Cirrus Logic International Semiconductor Ltd., Edinburgh (GB)

(72) Inventors: Roberto Brioschi, Austin, TX (US); David Patten, Austin, TX (US); Rkia Achehboune, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/788,499

(22) Filed: Oct. 19, 2017

(65) Prior Publication Data
US 2018/0127265 A1 May 10, 2018

Related U.S. Application Data

(60) Provisional application No. 62/418,364, filed on Nov. 7, 2016.

(30) Foreign Application Priority Data

Dec. 1, 2016 (GB) .................................. 1620434.9

(51) Int. Cl.
H01L 29/84 (2006.01)
B81B 7/00 (2006.01)
B81B 3/00 (2006.01)

(52) U.S. Cl.
CPC .......... B81B 7/0032 (2013.01); B81B 3/0064 (2013.01); B81B 7/0006 (2013.01); B81B 7/007 (2013.01); B81B 2201/0257 (2013.01); B81B 2207/012 (2013.01); B81B 2207/07 (2013.01); B81B 2207/091 (2013.01); B81B 2207/095 (2013.01); H01L 2224/48137 (2013.01); H01L 2224/49109 (2013.01); H01L 2924/15151 (2013.01)

(58) Field of Classification Search
CPC ... B81B 7/0032; B81B 7/0006; B81B 3/0064; B81B 2201/0257; B81B 2207/091
See application file for complete search history.

(56) References Cited

U.S. PATENT DOCUMENTS

| | | | | |
|---|---|---|---|---|
| 2007/0058826 A1* | 3/2007 | Sawamoto | ............. | H04R 19/04 381/174 |
| 2007/0205492 A1* | 9/2007 | Wang | .................... | B81C 1/0023 257/659 |
| 2011/0062573 A1* | 3/2011 | Zhe | ..................... | B81C 1/00301 257/680 |
| 2011/0274299 A1* | 11/2011 | Shaw | ................... | B81B 7/0064 381/174 |

(Continued)

FOREIGN PATENT DOCUMENTS

| | | |
|---|---|---|
| CN | 102131140 A | 7/2011 |
| CN | 104219612 A | 12/2014 |

OTHER PUBLICATIONS

Combined Search and Examination Report, UKIPO, Application No. GB1620434.9, dated Apr. 27, 2017.

(Continued)

Primary Examiner — Ismail A Muse
(74) Attorney, Agent, or Firm — Jackson Walker L.L.P.

(57) ABSTRACT

The application describes a package design for a MEMS transducer having an integrated circuit mounted within a chamber of the package. The integrated circuit may extend into a side wall recess of the package.

20 Claims, 9 Drawing Sheets

(56) References Cited

U.S. PATENT DOCUMENTS

| | | | |
|---|---|---|---|
| 2011/0293126 A1* | 12/2011 | Maekawa | H04R 19/005 |
| | | | 381/355 |
| 2011/0293128 A1* | 12/2011 | Kuratani | B81B 7/0064 |
| | | | 381/361 |
| 2012/0148083 A1* | 6/2012 | Knauss | H04R 19/04 |
| | | | 381/361 |
| 2013/0032936 A1* | 2/2013 | Formosa | H04R 19/005 |
| | | | 257/704 |
| 2013/0314885 A1* | 11/2013 | Ji | H05K 3/22 |
| | | | 361/760 |
| 2014/0161289 A1* | 6/2014 | Pan | H04R 19/04 |
| | | | 381/174 |
| 2014/0246738 A1 | 9/2014 | Protheroe et al. | |
| 2014/0246739 A1 | 9/2014 | Protheroe et al. | |
| 2015/0162319 A1* | 6/2015 | Scharf | H01L 23/3157 |
| | | | 257/659 |
| 2015/0304787 A1* | 10/2015 | Harney | H04R 1/086 |
| | | | 29/594 |
| 2015/0315014 A1* | 11/2015 | Protheroe | B81C 1/00269 |
| | | | 257/416 |
| 2015/0373446 A1* | 12/2015 | Chen | H04R 1/28 |
| | | | 381/111 |
| 2016/0029487 A1* | 1/2016 | Kondo | H01L 23/13 |
| | | | 174/261 |
| 2016/0204155 A1* | 7/2016 | Park | H01L 27/14636 |
| | | | 257/432 |
| 2016/0261941 A1* | 9/2016 | Brioschi | B81B 7/0058 |
| 2017/0194935 A1* | 7/2017 | Chiba | H03H 9/0547 |

OTHER PUBLICATIONS

Search Report, UKIPO, Application No. GB1620434.9, dated Jun. 16, 2017.

* cited by examiner

1. Die attach      FIG. 7A

2. Cavity attach      FIG. 7B

3. Wire bonding      FIG. 7C

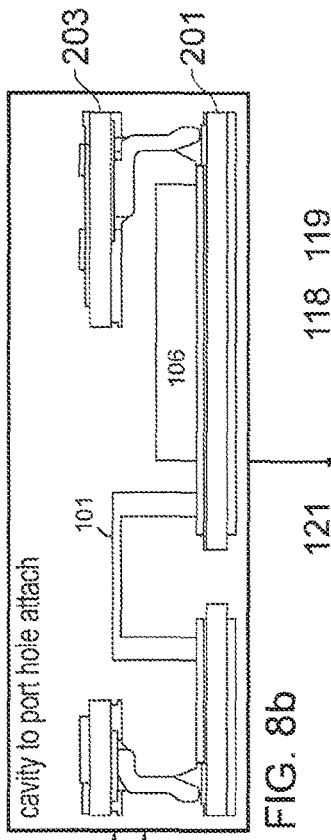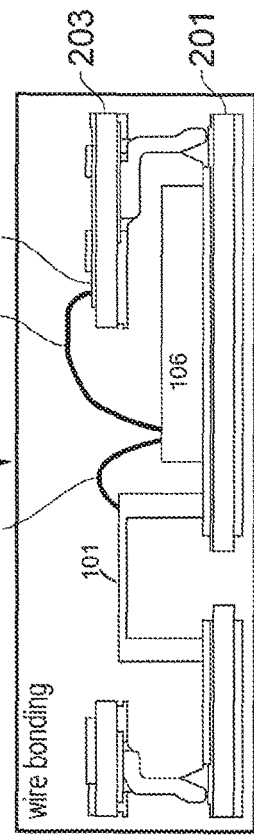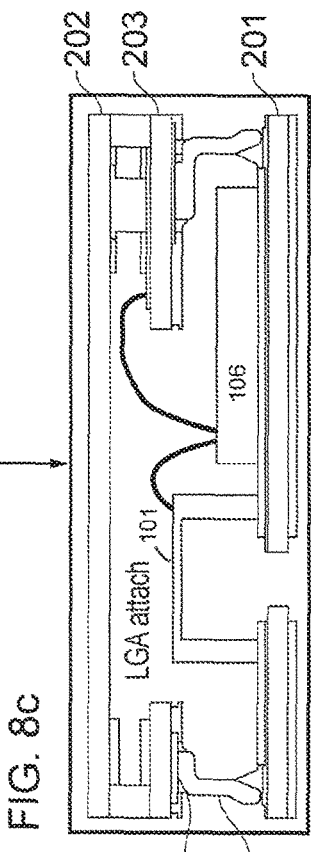

PACKAGE FOR MEMS DEVICE AND PROCESS

FIELD OF DISCLOSURE

This application relates to a transducer package and to methods and apparatus for packaging of a MEMS transducer. This application further relates to packages for or comprising a MEMS transducer, such as a MEMS microphone.

BACKGROUND

Consumer electronics devices are continually getting smaller and, with advances in technology, are gaining ever-increasing performance and functionality. This is clearly evident in the technology used in consumer electronic products and especially, but not exclusively, portable products such as mobile phones, audio players, video players, personal digital assistants (PDAs), various wearable devices, mobile computing platforms such as laptop computers or tablets and/or games devices. Requirements of the mobile phone industry for example, are driving the components to become smaller with higher functionality and reduced cost. It is therefore desirable to integrate functions of electronic circuits together and combine them with transducer devices such as microphones and speakers.

Micro-electromechanical-system (MEMS) transducers, such as MEMS microphones are finding application in many of these devices. There is therefore also a continual drive to reduce the size and cost of the MEMS devices.

Microphone devices formed using MEMS fabrication processes typically comprise one or more membranes with electrodes for read-out/drive that are deposited on or within the membranes and/or a substrate or back-plate. In the case of MEMS pressure sensors and microphones, the electrical output signal read-out is usually accomplished by measuring a signal related to the capacitance between the electrodes.

To provide protection the MEMS transducer will be contained within a package. The package effectively encloses the MEMS transducer and can provide environmental protection and may also provide shielding for electromagnetic interference (EMI) or the like. The package also provides at least one external connection for outputting the electrical signal to downstream circuitry. For microphones and the like the package will typically have a sound port to allow transmission of sound waves to/from the transducer within the package and the transducer may be configured so that the flexible membrane is located between first and second volumes, i.e. spaces/cavities that may be filled with air (or some other gas suitable for transmission of acoustic waves), and which are sized sufficiently so that the transducer provides the desired acoustic response. The sound port acoustically couples to a first volume on one side of the transducer membrane, which may sometimes be referred to as a front volume. The second volume, sometimes referred to as a back volume, on the other side of the one of more membranes is generally required to allow the membrane to move freely in response to incident sound or pressure waves, and this back volume may be substantially sealed (although it will be appreciated by one skilled in the art that for MEMS microphones and the like the first and second volumes may be connected by one or more flow paths, such as small holes in the membrane, that are configured so as present a relatively high acoustic impedance at the desired acoustic frequencies but which allow for low-frequency pressure equalisation between the two volumes to account for pressure differentials due to temperature changes or the like).

Various package designs are known. For example, FIGS. 1a and 1b illustrate "lid-type" packages 100. A MEMS transducer 101 is mounted to an upper surface of a package substrate 102. The package substrate 102 may be PCB (printed circuit board) or any other suitable material. A cover or "lid" 103 is located over the transducer 101 and is attached to the upper surface of the package substrate 102. The cover 103 may be a metallic lid. In FIG. 1a, an aperture 104 in the cover 103 provides a sound port and allows acoustic signals to enter the package. In FIG. 1b an aperture 104 in the substrate 102 provides the sound port and the MEMS transducer is mounted such that the flexible membrane of the transducer extends over the sound port.

The package may also contain an integrated circuit (not shown). The integrated circuit will typically be formed on a die of semiconductor material and will be customised for a particular application. The integrated circuit will be electrically connected to electrodes of the transducer 101 and an electrically conductive path will be provided between the integrated circuit and an electrical connection provided on an external surface of the package. The integrated circuit may provide bias to the transducer and may buffer or amplify a signal from the transducer.

FIG. 2 illustrates an alternative package type known as a "laminate to laminate" package. The package shown in FIG. 2 comprises a first member 201 comprising a FR-4 board core having a solder mask stop layer applied to the upper and lower surfaces thereof, a second member 202 disposed in a plane overlying the first member and comprising an FR-4 board coated on an inner/lower surface thereof with a solder stop layer 111, and a third member 203 (or "interposer member") which is interposed between the first and second members. The third member forms at least a part of the side walls of the package. The third member can be considered to comprise a cavity or void such that, when the three members are bonded together e.g. by means of solder bonds 110, a space or chamber 204 is formed between the lower surface of the second member 202 and an upper surface of the first member 201, wherein the side walls of the chamber are partially provided by the cavity edges of the third member 203. A transducer 101 and an integrated circuit 106 are provided within the chamber 204.

Although several different arrangements are known, according to the FIG. 2 arrangement a port hole 104 extends through the first member of the package and an external electrical connection 105, which may for example comprise solder pads or the like, is provided on the outer surface of the second member. According to convention, the configuration shown in FIG. 2—in which the sound port is provided on opposite side of the package to the external electrical connection—is known as a "top port" configuration. It will be appreciated that the term "top port" does not imply any particular orientation of the package device either during manufacture, processing or any subsequent application. In this example, the acoustic port 104 is provided by means of a cavity comprised in the first member which, according to the orientation of the package shown in FIG. 2, is actually illustrated as being beneath the second member.

In the top port arrangement of FIG. 2, the transducer 101 is supported in a fixed relationship with respect to the first member 201 and is arranged such that the flexible membrane of the transducer extends over—or overlies—the acoustic port 104. The transducer is connected to an integrated circuit 106 which is also supported by the first member. Specifically, the transducer and the integrated circuit are mounted on the solder stop mask layer 111 provided on the upper surface of the first member. It will be appreciated that in order for an electrical signal generated by the integrated circuit to be output from the package, an electrically conductive path must be provided from the integrated circuit 106, which is mounted on an inner surface of the first member, to the external electrical connection 105, which is provided on an outer surface of the second member 202.

As shown in FIG. 2, this is achieved by means of a plurality of conductive vias (vertical interconnected access) 109a and 109b which are provided through the third member 203 and the second member 202 respectively. The vias allow an electrical connection to be made from the lower plane of the integrated circuit up to the upper plane of the external electrical connection 105. Furthermore, an electrical contact 112 on the upper surface of the first member and a conductive path across the first member (in this illustrated example including an embedded horizontal portion) to a metal solder pad 117 are provided to form an electrically conductive path from the integrated circuit 106 to a solder bond 110v which is directly connected from pad 117 to the bottom of the via 109a.

From consideration of FIG. 2, and also from FIG. 3 which shows a view from above of a cross-section taken through the plane of the third member, it will be appreciated that the lateral dimensions of the inner chamber of the package that is formed between the edges of the cavity of the third member will depend on the width S of the sidewalls formed by the third member. Moreover, it can be seen that the portion of the third member which incorporates the vias exhibits a greater width W than the other side walls of the package. Thus the lateral dimensions, i.e. the width of the portion of the chamber that is defined between the side walls formed by the third member, is limited for a given external package size by the need for a minimum side wall width to provide a required mechanical strength and the provision of side wall vias which result in a wider side wall dimension along one or more of the side walls. This is further compounded by the provision of the electrical contact 112 and pad 117 and the need for an intervening solder dam of material 111 which all occupy lateral space on the first member.

It will be appreciated that the restrictions on chamber size which arise a consequence of the manner in which an inter-planar electrical connection is provided from the lower plane of the first member to the upper plane of the second member, also restricts the size of the integrated circuit die which can potentially limit the functionality of the integrated circuit.

Although it would be possible to compensate for the lateral space occupied by the wider side-wall by increasing the overall footprint of the package, this would increase the materials and production cost of each package. The larger package might render the product unsuitable for some end-user applications, for example earbuds, where space constraints are particularly severe. Also it will be appreciated that many industrial processes for manufacturing MEMS transducer packages utilise a standardised package configuration wherein the external dimensions of the package, including the footprint, are fixed. This approach offers a number of distinct advantages in terms of economies of scale and automation during manufacturing and/or assembly.

SUMMARY

Aspects of the present invention relate to a package for a transducer, in particular to a package for a MEMS transducer.

According to a first aspect there is provided a package for a MEMS transducer comprising:
a first member;
a second member provided in a plane overlying the first member;
a chamber provided between the first and second members;
a third member interposed between the first and second members, wherein the third member comprises a cavity which extends through the plane of the third member and forms part of the chamber,
wherein an integrated circuit is provided within the chamber of the package and is mounted on the first member, wherein an electrically conductive path is provided directly between the integrated circuit and an electrical contact provided on an upper region of the third member.

Thus, the or each electrical contact, or electrically conductive region, provided on an upper region e.g. an upper surface of the third member may form an electrical terminal of a direct electrical connection between the integrated circuit and the upper plane of the third member. The electrically conductive path may be provided by wire bonding directly between the integrated circuit and the, or each electrical contact. As such, the need for via 109a through the third member in order to provide an electrically conductive path between planes from the first member to the upper surface of the third member, is obviated. As a result the width W of the side-wall portion that would otherwise comprise the via may potentially be reduced. Furthermore, such a configuration further obviates the need for the electrical contact 112, the electrically conductive path 113, pad 117 and the solder bond 110v which is provided at the bottom of the via 109s.

It will be appreciated that this creates free space inside the package chamber. Specifically, the width of the sidewall in the region of the package associated with providing an electrically conductive path to the external contact may potentially be reduced, thus increasing at least a part of the size of the cavity in the third member and thus the projection of the footprint of the cavity on the upper surface of the third member.

Further, a greater vertical clearance or vertical space is created between the first member and a portion of the third member. This enhanced vertical clearance may advantageously create a region between the first member and the third member into which the integrated circuit may at least partially be provided. The region between the first member and the third member can be considered to form a recess within a side wall of the package chamber.

Thus, it can be appreciated that examples of the first aspect benefit from the potential for the volume and/or footprint of the inner chamber to be increased relative to the external package size (in particular the package width). Alternatively, and/or additionally, it can be appreciated that examples of the first aspect benefit from the potential for the for the external package size to be decreased relative to the inner chamber volume and/or footprint.

In many instances it is particularly desirable to maintain a standard package size. Examples of the first aspect benefit from the creation of space within the chamber which may be utilised for an alternative purpose. In particular, the space created as a consequence of the direct electrical connection between the integrated circuit and an electrical contact provided on an upper region of the third member may be beneficially utilised for an integrated circuit die and/or a transducer having a greater footprint and possibly thus better parametric performance or greater circuit functionality.

Thus, the functionality of the package may be enhanced by the provision of more lateral space within the package chamber.

According to a second aspect of the present invention there is provided a package for a MEMS transducer comprising:

a first member;

a second member provided in a plane overlying the first member;

a chamber provided between the first and second members;

a third member interposed between the first and second members, the third member at least partially forming a side-wall of the package, wherein the third member comprises an intermediate cavity which extends through the plane of the third member and forms part of the chamber, wherein an integrated circuit is provided within the chamber and is mounted on the first member, wherein the package comprises a side-wall recess formed between the first member and the third member and an integrated circuit, and wherein at least a part of the integrated circuit is provided within the side-wall recess.

According to one example, a part of the integrated circuit extends into a side wall recess formed beneath the third member between the third member and the first member. Thus, the integrated circuit extends laterally outside a region defined by the cavity of the third member. This configuration is enabled as a consequence of the vertical clearance created beneath the third member by the absence of components which would be required to form an electrically conductive path to a via in the third member, and also as a consequence of the horizontal clearance or lateral space created in the region adjacent to the side wall between the side wall and the transducer.

One or more of the first member, the second member and the third member comprise PCB or FR-4 board. In some examples, all three or at least two of the members are formed of PCB or FR-4 board. In some embodiments, one or both of the first member or the second member may be formed of a material other than PCB or FR-4 board. For example, the first member may be formed of silicon, moulded plastic or ceramic.

The PCB or FR-4 board or silicon may be considered to form a core of a given member. The core may be provided with one or more layers—such as an insulating layer or solder mask layer—on the upper and/or lower surface thereof. The core of the first member may thus comprise an upper layer provided on an upper surface thereof. The transducer and the integrated circuit will thus be mounted to the upper layer of the first member.

In order to further enhance vertical clearance that is created beneath the third member, as discussed above, according to one embodiment an upper layer is provided only on a first region of the upper surface of the core of the first member and is not provided on a second region of the upper surface of the first member. Indeed, as a result of the direct electrically conductive path that is provided between the integrated circuit and the electrical contact on the top of the third member, the need for the intervening solder dam 111 which had served to protect the conductive components 112 and 117 is obviated.

Preferably at least a part of the second region is provided beneath (or so as to underlie) the third member and/or in a plane beneath the electrical contact provided on the upper region of the third member. The integrated circuit may be mounted to the first member in the second region and is therefore mounted directly on the core of the first member. Due to the lack of the upper layer on the surface of the first member in the second region, additional vertical clearance is provided which can be utilised for the integrated circuit. In particular, it is possible to locate the integrated circuit so that it extends beneath the third member. This allows for the footprint of the integrated circuit to be increased.

The core of the third member may typically be provided with an insulating or solder mask layer on a lower surface thereof. Examples are also envisaged in which the insulating or solder mask layer provided on a lower surface of the third member is omitted/removed in order to enhance the clearance between the first and third members.

According to one example the package comprises a lid structure which may be formed of metal. The lid structure can be considered to comprise side portions, which are mounted to the first member, and an upper surface portion. The upper surface portion of the lid structure may provide a layer of the third member. Thus, the upper surface of the lid structure may comprise a lid cavity which substantially coincides with cavities formed in the other layers of the third member to thereby form the cavity of the third member.

The recess may be around 100 microns in height, or between 60 microns and 200 microns. It will be appreciated that the actual height of the recess provided in a given package will depend on the design of the package including the construction of the side-walls, the depth of the third member, the presence/absence of additional layers (e.g. insulating layers and or solder mask layers) provided on the upper surface of the core of the first member and/or on the lower surface of the core of the third member and the soldering techniques for bonding the first and third members together.

The second member may be provided with an external electrical contact on an outer surface thereof. Furthermore, the second member may comprise a via for providing at least part of an electrically conductive path for electrically connecting the electrically conductive region provided on the upper region of the third member and the external electrical contact of the package.

The first, second and third members are typically bonded together by means of solder bonds.

According to another aspect, there is provided a method of fabricating a package for a MEMS transducer as described in any of the examples herein.

According to one example, the first member comprises a sound port which extends through the plane of the first member. The package may comprise a MEMS transducer, or MEMS transducer die, provided within the chamber. The MEMS transducer may comprise a flexible membrane and may be provided within the package such that the flexible membrane overlies the sound port of the first member.

The MEMS transducer may comprise a MEMS microphone or any form of MEMS transducers other than microphones, for example pressure sensors or ultrasonic transmitters/receivers.

The integrated circuit may comprise analogue circuitry or digital circuitry. The integrated circuit may comprise a digital signal processor.

In some examples the integrated circuit may comprise a MEMS transducer co-integrated on a common die.

In some embodiments the package comprises multiple MEMS transducers. At least one of said multiple MEMS transducers may be a different type of transducer to at least one other of said multiple MEMS transducers. The MEMS transducer may be a MEMS microphone.

An electronic device may comprise a MEMS transducer package as previously described. The electronic device may be: a portable device; a battery power device; a computing device; a communications device; a gaming device; a mobile telephone; a personal media player; a laptop, tablet or notebook computing device.

BRIEF DESCRIPTION OF THE DRAWINGS

For a better understanding of the present invention, and to show how the same may be carried into effect, reference will now be made by way of example to the accompanying drawings in which:

FIGS. 7a to 7d illustrate a series of stages of a process for fabricating the MEMS transducer package of the second example; and FIGS. 8a to 8d illustrate a series of stages of a process for fabricating the MEMS transducer package of the third example.

DETAILED DESCRIPTION

Figure 1A:
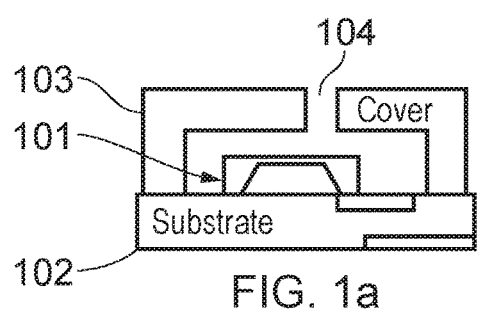
FIGS. 1a and 1b illustrate previously considered "lid-type" package designs.
Figure 1B:
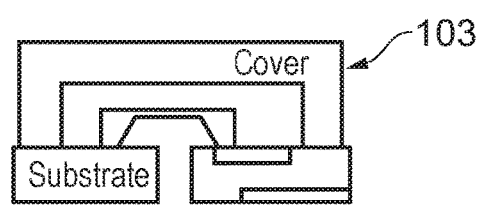

Throughout this description any features which are similar to features in other figures have been given the same reference numerals. Examples will be described in relation to packaging for, or comprising, a MEMS transducer in the form of a MEMS capacitive microphone in which the primary membrane is supported in a fixed relation relative to an acoustic port provided in the package. It will be appreciated, however, that the invention is equally applicable to package for or comprising other types of MEMS transducer including other capacitive-type transducers.

Figure 4:
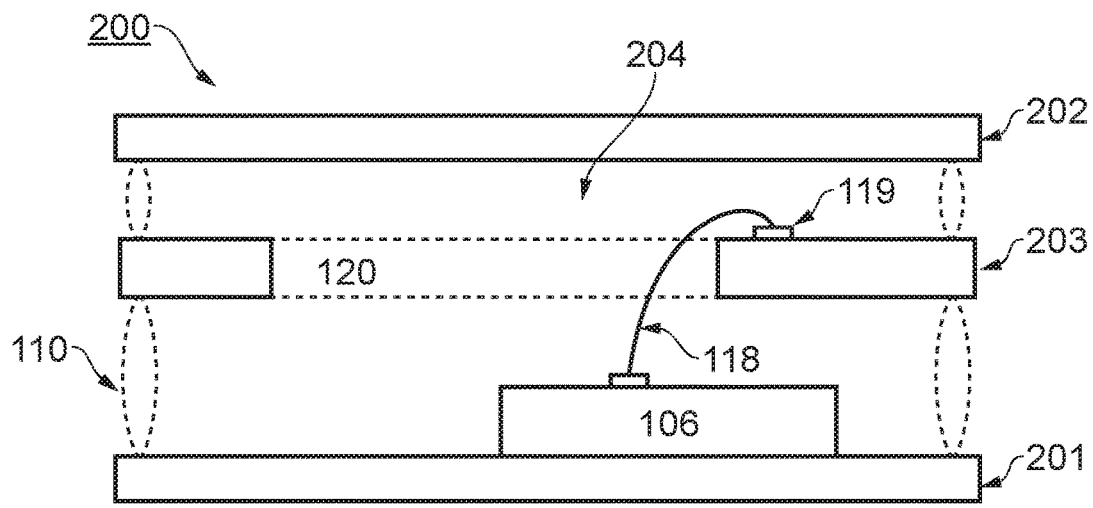
FIG. 4 schematically illustrate s a cross section through a package according to a first example.

FIG. 4 schematically shows a cross section through a package 200 according to a first example. The package 200 comprises a first member 201, a second member 202 provided in a plane overlying the first member and a third member 203 interposed between the first and second members. The third member comprises a cavity 120 indicated by the broken lines which extends through the plane of the third member and forms part of a chamber 204 provided between the first and second members. An integrated circuit 106 is mounted on the first member 201. An electrically conductive path 118 is provided directly between the integrated circuit 106 and an electrical contact 119 provided on an upper region of the third member.

As shown in FIG. 4, the electrically conductive path 118 is provided by means of wire bonding between the integrated circuit and the electrical contact 119.

As a result of the direct electrical connection provided between the integrated circuit 106 and the electrical contact 119, the third member 203 need not comprise any vias for providing an electrically conductive path through the plane of the third member. Furthermore, a number of components that would be required for facilitating connection from the integrated circuit to such a via are also not provided. Thus, the integrated circuit is able to occupy a greater surface area on the first member within the chamber. In particular, according to this example, the integrated circuit has been located so as to extend underneath a part of the third member. Thus, the area available for the integrated circuit has been increased as compared to previous package designs.

For simplicity the FIG. 4 example illustrates a single direct connection—or wire bond—between the integrated circuit and the top of the third member. However, it will be appreciated that there will often comprise a plurality of electrical contacts on the upper region of the third member to allow electrically conductive paths to be provided between several terminals of the integrated circuit and further external electrical contacts. Thus, there will typically be three terminals provided on the integrated circuit corresponding to power, ground and output (or two if the output signal is superimposed on the power lead). In the case of digital circuitry, there will also generally be a clock line and possibly a fifth control pin.

Figure 5A:
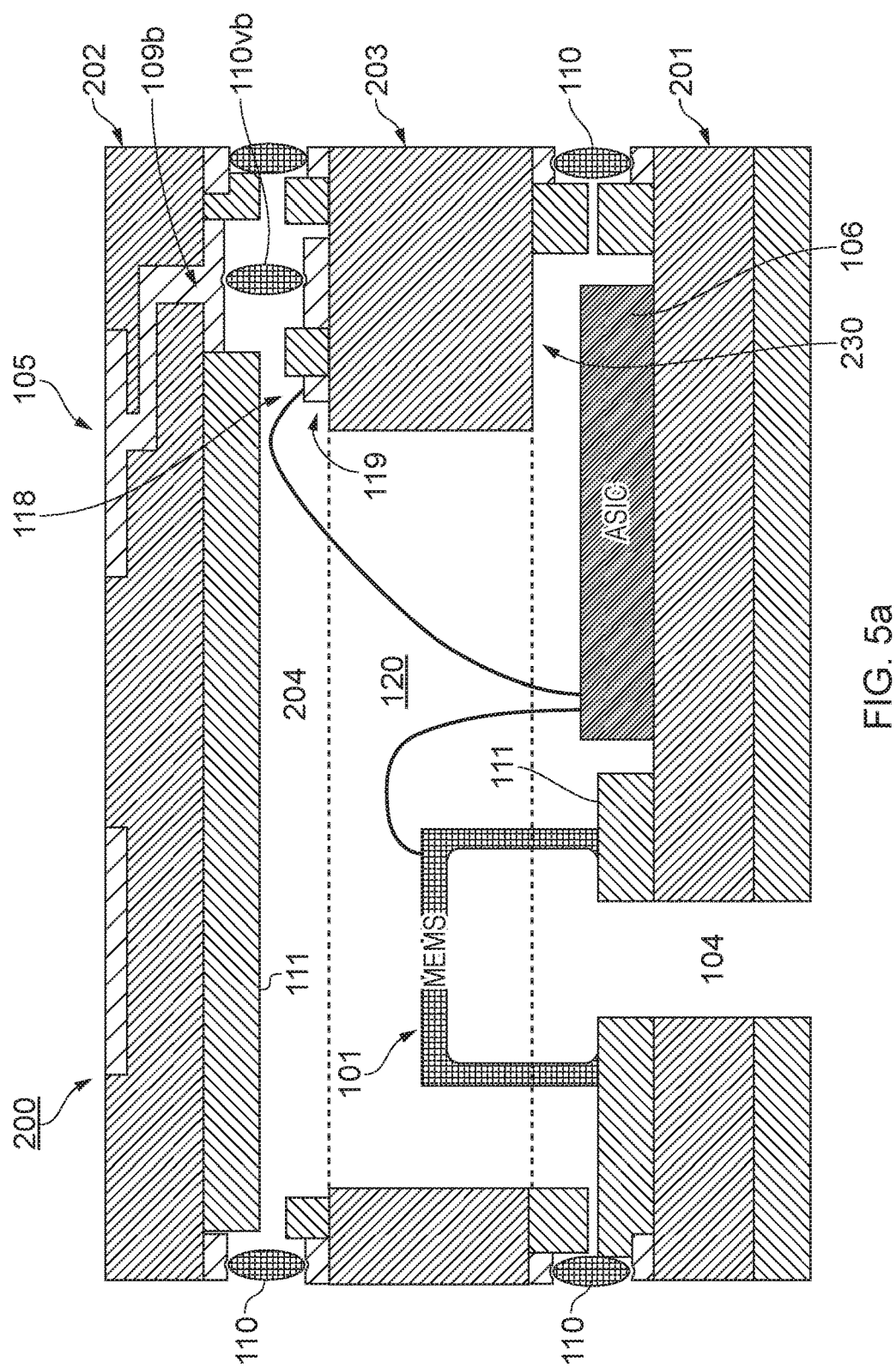
FIG. 5a schematically illustrate s a cross section through a MEMS transducer package according to a second example.

FIG. 5a schematically shows a cross section through a MEMS transducer package according to a second example. The package 200 comprises a first member 201, a second member 202 provided in a plane overlying the first member and a third member 203 interposed between the first and second members. The third member comprises a cavity 120 indicated by the broken lines which extends through the plane of the third member and forms part of a chamber 204 provided between the first and second members. A transducer 101 is supported with respect to the first member 101 and overlies an acoustic port 104 provided through the plane of the first member. The transducer—which in this example comprises a MEMS microphone comprising a flexible membrane arranged to overlie the port 104—is electrically connected to an integrated circuit 106 mounted with respect to the first member 201. The first member may, for example, comprise PCB or FR-4 board which forms a core of the first member and which is created in a first region with a solder mask layer 111. The thickness of the mask layer is around 20 microns. Two electrically conductive paths 118 are provided by means of wire bonding directly between the integrated circuit 106 and associated electrical contacts 119 provided on an upper region of the third member. The electrical contact 119 connects to the solder bond 110vb by means of a metal track or region of conductive material which is "in the paper" (i.e. not shown in illustrated cross-section), thereby creating an electrically conductive path through a via 109b to an external contact 105 provided on the upper surface of the second member of the package.

The vertical clearance or vertical space that is provided between the first member and a portion of the third member effectively creates a recess 230 between a portion of the third member 203 and a portion of the first member 201. Specifically, as more clearly illustrated in FIG. 5b which shows a cut-away perspective view of the MEMS transducer package according to the second example, this recess is provided within the side wall of the package that is associated with the provision of an electrically conductive path to the external electrical contact 105. The recess is around 100 microns in depth and is sufficient to allow the integrated circuit—which in this example is around 55 microns depth—to extend within the recess. In this particular example, the height of the recess has been enhanced by patterning a solder mask layer 111 that is provided on the upper surface of the core of the first member such that the solder mask layer—which is typically around 20 microns depth—is not provided beneath the integrated circuit. Thus, the integrated circuit 106 is mounted directly to the core of the first member. Furthermore, the insulating or solder mask layer provided on a lower surface of the third member is also patterned so as to not be provided in the region of the recess to further enhance the clearance between the first and third members.

Figure 2:
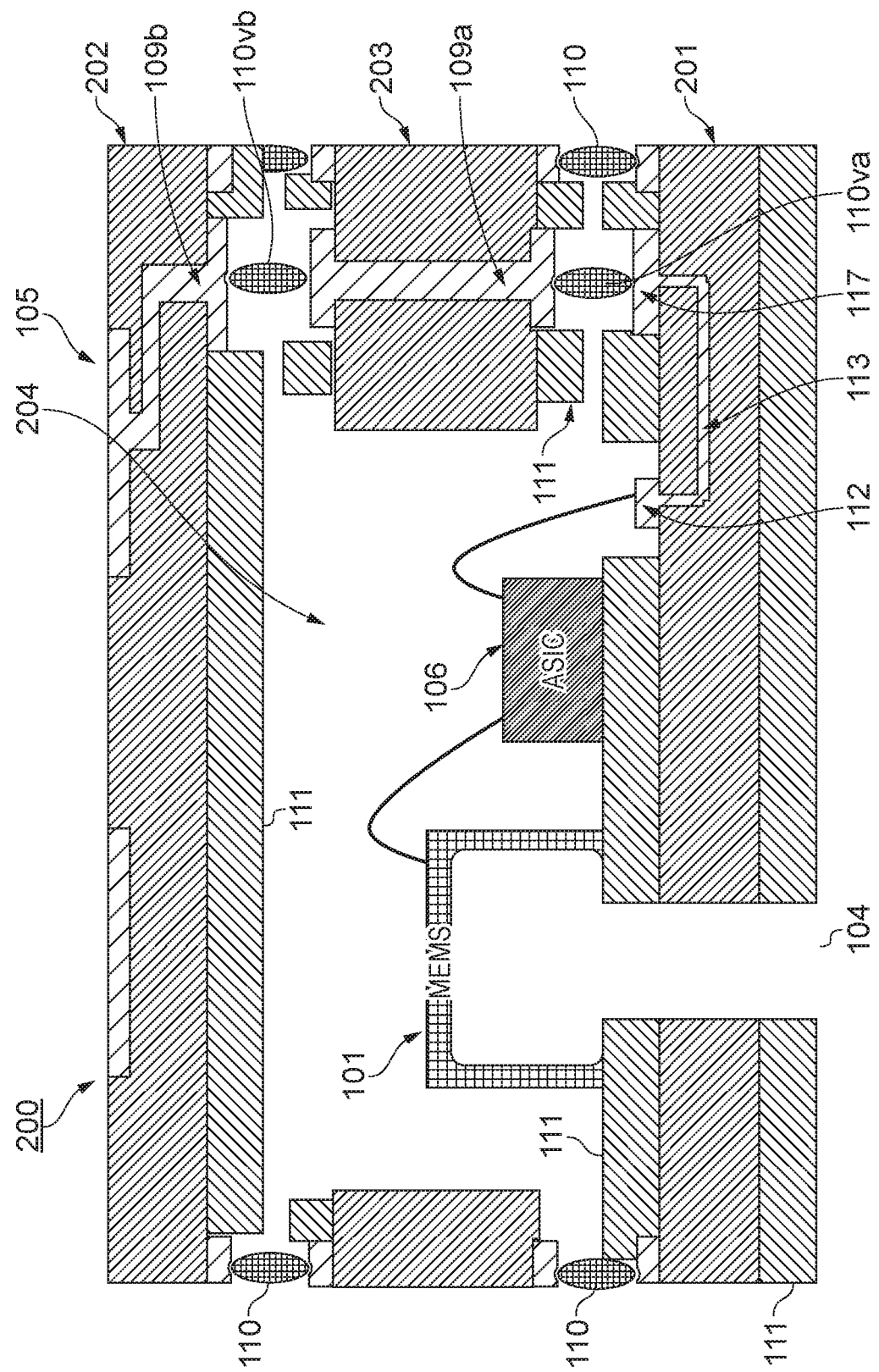
FIG. 2 illustrate s a previously considered "laminate to laminate" package design FIG. 3 illustrate s a cross-sectional view of the FIG. 2 package from above.
Figure 3:
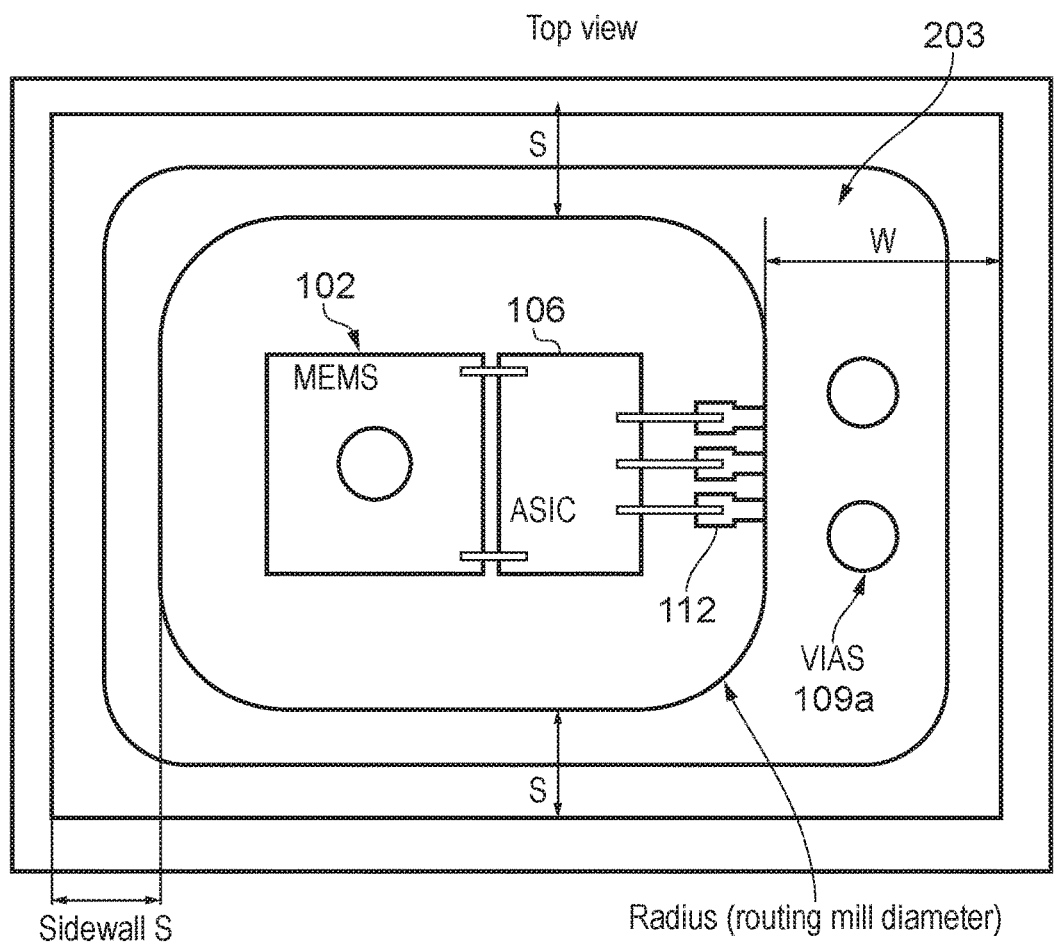
Figure 5B:
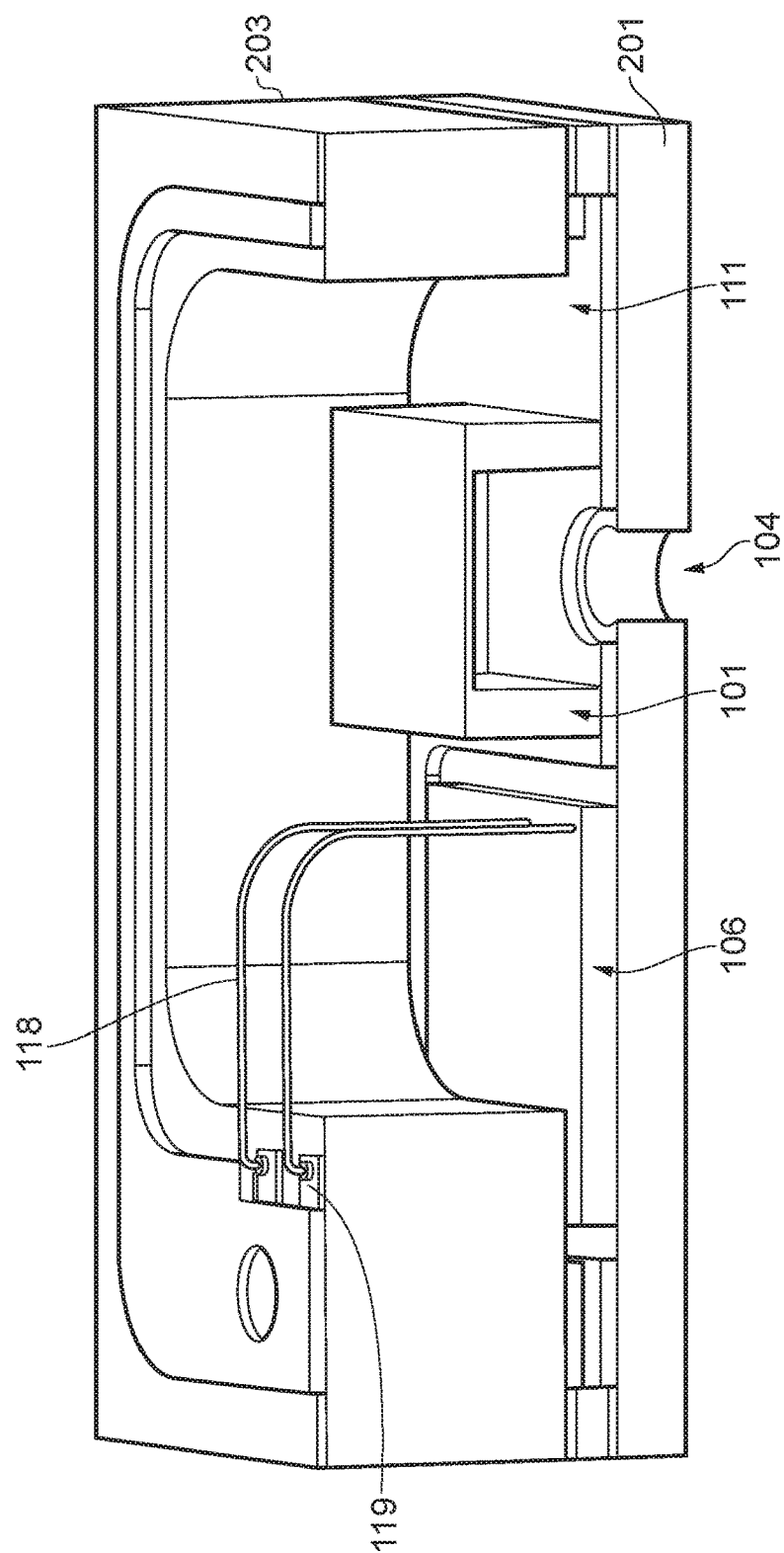
FIG. 5b illustrate s a cut-away perspective view of the MEMS transducer package according to the second example.

From consideration of FIGS. 5a and 5b and with comparison to the previously considered arrangement shown in FIG. 2, it can be seen that the footprint area of the integrated circuit is significantly increased. The functionality of the integrated circuit may thus be expanded to include say a programmable digital signal processor core to enable complex digital signal processing functions such as voice or trigger phrase or command phrase detection within the microphone package, for example in an in-ear end user device such as an earbud or in-ear hearing aid.

Furthermore, the backside volume of the transducer i.e. the total volume of air in communication with the top surface of the flexible membrane of the transducer 101, may be enhanced.

Figure 6A:
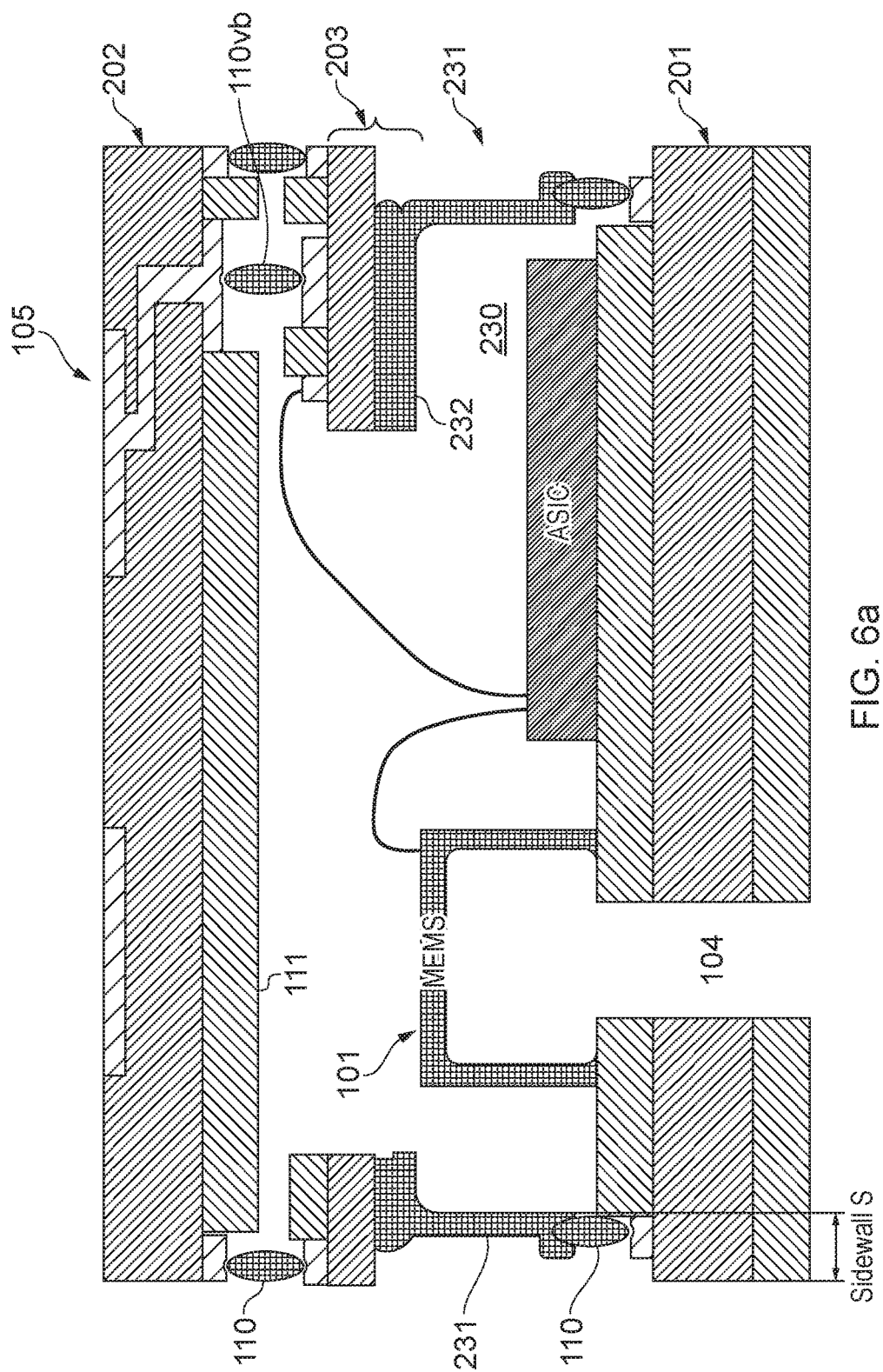
FIG. 6a schematically illustrates s a cross section through a MEMS transducer package according to a third example.
Figure 6B:
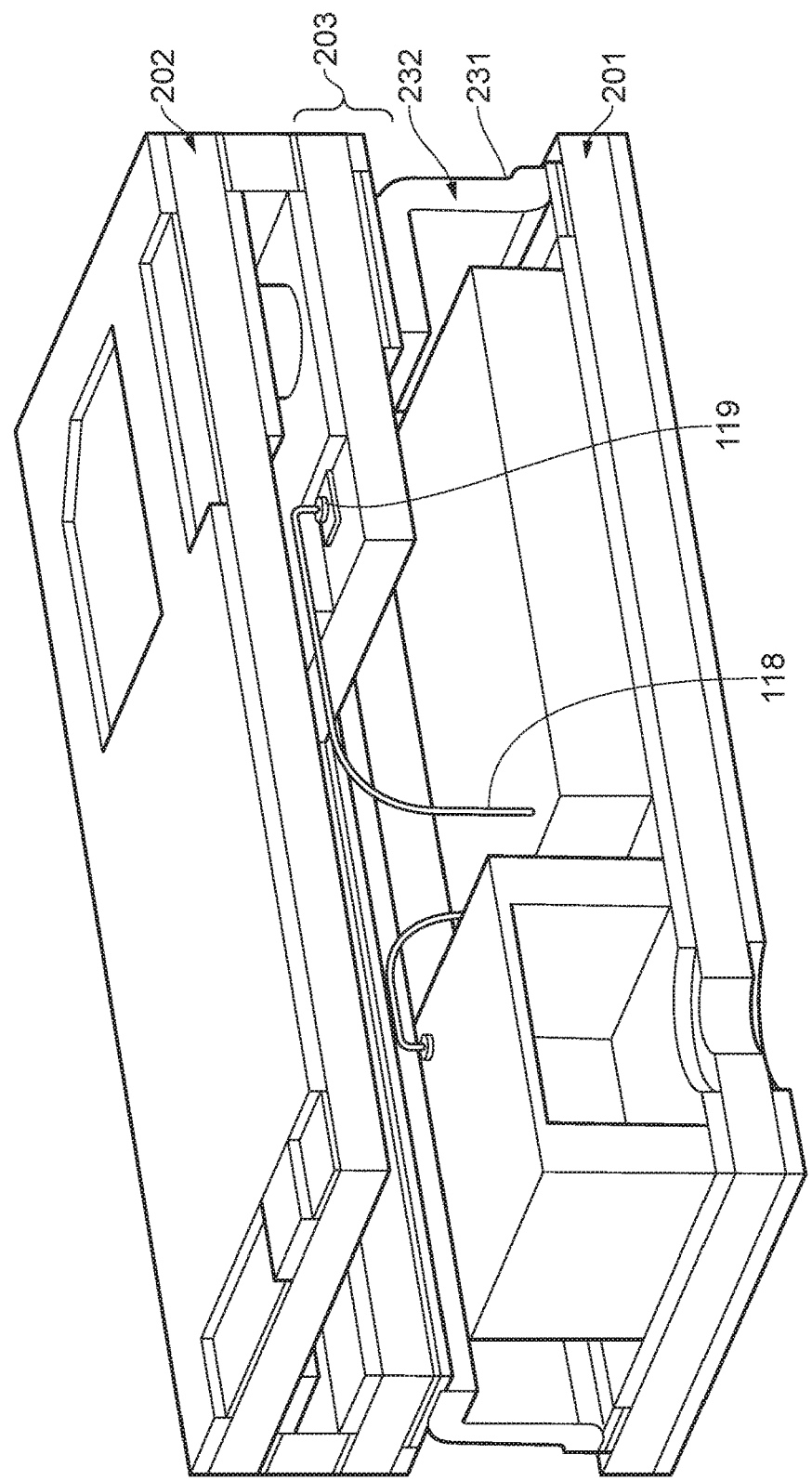
FIG. 6b illustrates a cut-away perspective view of the MEMS transducer package according to the third example.

FIG. 6a schematically shows a cross section through an alternative MEMS transducer package according to a third example. A cut-away perspective view of the MEMS transducer package is shown in FIG. 6b.

In this example, the package comprises a metal lid structure comprising side wall portions 231 and an upper portion 232. The third member 203 is provided by a multi-layer structure comprising e.g. a layer of FR-4 board bonded to the upper portion of the metal lid structure. The upper portion comprises a lid-cavity which substantially coincides with cavities formed in the other layers of the third member to thereby form the intermediate cavity of the third member. An electrically conductive paths 118 is provided by means of wire bonding directly between the integrated circuit 106 and an associated electrical contact 119 provided on an upper region of the third member. Although FIGS. 6a and 6b only illustrate a single wire connection, it will be appreciated that further direct connections may be provided.

As with the second example, the vertical clearance provided between the first member and a portion of the third member effectively creates a recess 230 between a portion of the third member 203 and a portion of the first member 201. This example benefits from enhanced vertical height within the inner chamber which arises as a consequence of the thinner depth of the third member and the height of the side portions 231 of the lid structure. Thus there is greater benefit in terms of increased chamber back volume in communication with the transducer. In this example, and due to the vertical height provided by the lid structure, the integrated circuit is mounted on the solder mask layer, though in other similar examples the solder mask layer may be removed in the region of the integrated circuit to further increase the volume of the chamber.

In the illustrated examples of the present invention one or more of the first member, the second member and the third member comprise PCB or FR-4 board. In some examples, all three or at least two of the members are formed of PCB or FR-4 board. In some embodiments, one or both of the first member or the second member may be formed of a material other than PCB or FR-4 board. For example, the first member may be formed of silicon, plastic or ceramic.

According to the examples illustrated in FIGS. 5 and 6 the electrical contact that is provided on the upper region of the third member is located on the sidewall of the third member that is most conveniently associated with providing an electrically conductive path between the integrated circuit and the external electrical contact 105. More than one electrical contact may be provided on the upper region of the third member located on the same sidewall of the third member to allow further electrically conductive paths to be provided between other terminals of the integrated circuit and further external electrical contacts. The reader will appreciate that other configurations are also envisaged in which one or more direct electrical connections may be made to electrical contacts provided on a different side wall of the package. Examples are thus envisaged in which a plurality of direct connections may be made between the integrated circuit and the upper plane of the third member, thus potentially requiring a plurality of electrical contacts to be provided in different locations around the upper region of the third member. It is also envisaged that a recess extending from the inner chamber may be provided within one or more of the side walls of the package or may extend all the way around the chamber between the first and third members of the package.

FIGS. 7a to 7d illustrate a series of stages of a process for fabricating the MEMS transducer package of the second example.

As shown in FIG. 7a, a first member 201 is provided having a MEMS microphone transducer 101 and an integrated circuit 106 provided thereon. The first member 201 comprises an FR-4 board core and a solder mask layer 111 patterned using conventional photolithographic techniques. A hole is provided in the solder mask layer in a region of the first member where the integrated circuit is attached.

As shown in FIG. 7b, a third interposer member is bonded to the first member by means of solder bonds 110. The third member comprises an FR-4 board and is provided with a cavity 120 therein. An upper surface of the third member is provided with a first electrical contact 119. The upper surface of the third member is further provided with a second electrical contact 122 which is electrically connected to the first electrical contact (connection not shown).

As shown in FIG. 7c, a first electrical connection 121 is formed between the transducer 101 and the integrated circuit 106. A second electrical connection 118 is formed directly between the integrated circuit 106 and the electrical contact 119. These connections may be made using conventional wire-bonding techniques.

Figure 7D:
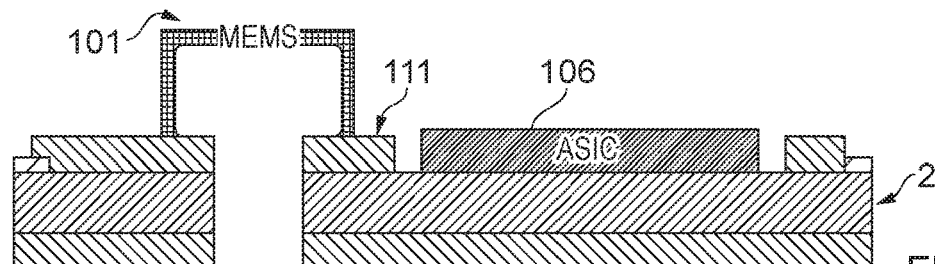
Figure 7D:
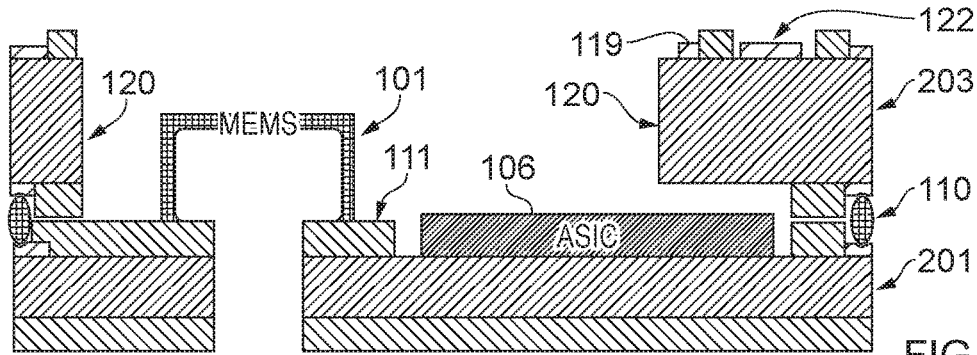
Figure 7D:
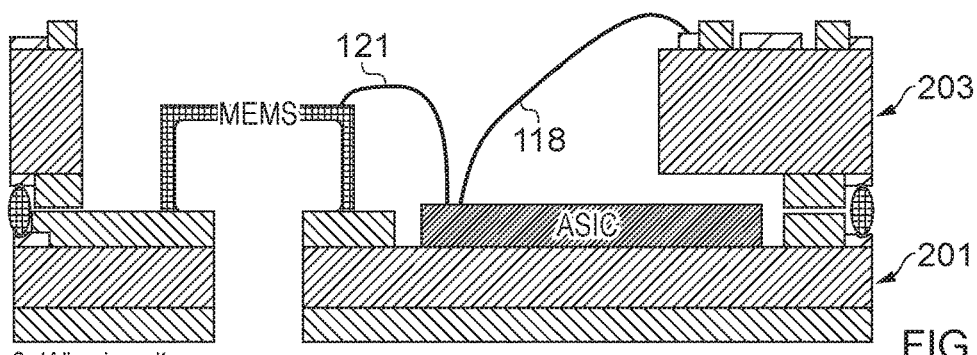
Figure 7D:
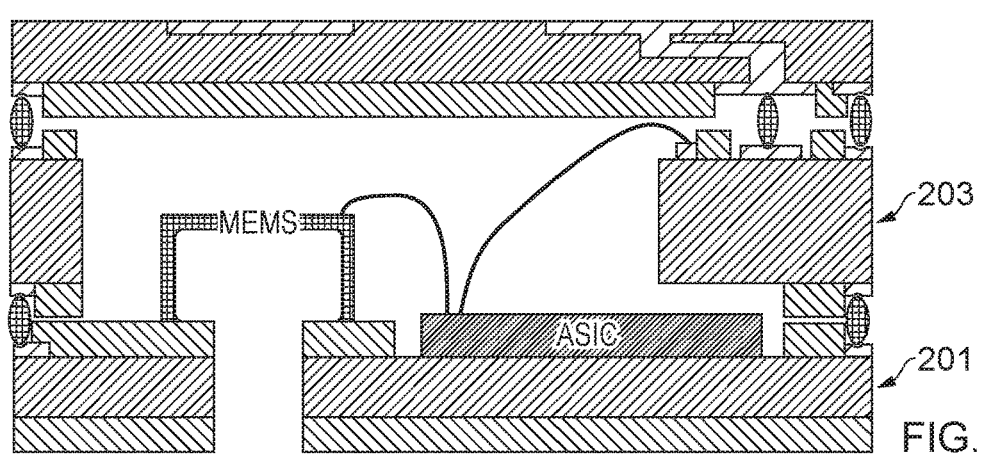

Finally, as shown in FIG. 7d, a second member 202 is bonded to the third member by means of solder bonds 110 so as to overlie the first member. A solder bond 110vb is also formed between the second electrical contact 122 and a via 109b provided in the third member. Thus, an electrically conductive path is provided from the integrated circuit 106 to an external electrical contact 105 provided on an outer surface of the package.

FIGS. 8a to 8d illustrate a series of stages of a process for fabricating the MEMS transducer package of the third example.

As shown in FIG. 8a, a first member 201 is provided having a MEMS microphone transducer 101 and an integrated circuit 106 provided thereon. The first member 201 comprises an FR-4 board core and a solder mask layer 111 patterned using conventional photolithographic techniques. As shown in FIG. 8b, an assembly comprising a metal lid structure 231 bonded along an upper portion 232 thereof to a layer of FR-4 board—thus forming a third member of the package—is bonded to the first member by means of solder bonds 110.

As shown in FIG. 8c, a first electrical connection 121 is formed between the transducer 101 and the integrated circuit 106. A second electrical connection 118 is formed directly between the integrated circuit 106 and the electrical contact 119. These connections may be made using conventional wire-bonding techniques.

Finally, as shown in FIG. 8d, a second member is bonded to the third member 203 resulting in a package according to the third example.

It should be understood that the various relative terms upper, lower, top, bottom, underside, overlying, beneath, etc. that are used in the present description should not be in any way construed as limiting to any particular orientation of the transducer during any fabrication step and/or it orientation in any package, or indeed the orientation of the package in any apparatus. Thus the relative terms shall be construed accordingly.

It should be understood that reference to the transducer and/or integrated circuit being "mounted on" the first member should be interpreted as requiring that the transducer and/integrated circuit are directly mounted on the first member, but should encompass examples in which the transducer and/or integrated circuit are indirectly mounted on the first member. Thus, one or more other layers may be provided between the first member and the transducer and/or integrated circuit.

Examples described herein may be usefully implemented in a range of different material systems, however the examples described herein are particularly advantageous for MEMS transducers having membrane layers comprising silicon nitride.

In the examples described above it is noted that references to a transducer may comprise various forms of transducer element. For example, a transducer may be typically mounted on a die an may comprise a single membrane and back-plate combination. In another example a transducer die comprises a plurality of individual transducers, for example multiple membrane/back-plate combinations. The individual transducers of a transducer element may be similar, or configured differently such that they respond to acoustic signals differently, e.g. the elements may have different sensitivities. A transducer element may also comprise different individual transducers positioned to receive acoustic signals from different acoustic channels.

It is noted that in the examples described herein a transducer element may comprise, for example, a microphone device comprising one or more membranes with electrodes for read-out/drive deposited on the membranes and/or a substrate or back-plate. In the case of MEMS pressure sensors and microphones, the electrical output signal may be obtained by measuring a signal related to the capacitance between the electrodes. The examples are also intended embrace a transducer element being a capacitive output transducer, wherein a membrane is moved by electrostatic forces generated by varying a potential difference applied across the electrodes, including examples of output transducers where piezo-electric elements are manufactured using MEMS techniques and stimulated to cause motion in flexible members.

It is noted that the examples described above may be used in a range of devices, including, but not limited to: analogue microphones, digital microphones, pressure sensor or ultrasonic transducers. The invention may also be used in a number of applications, including, but not limited to, consumer applications, medical applications, industrial applications and automotive applications. For example, typical consumer applications include portable audio players, wearable devices, laptops, mobile phones, an earphone or in-ear hearing aid, PDAs and personal computers. Examples may also be used in voice activated or voice controlled devices. Typical medical applications include hearing aids. Typical industrial applications include active noise cancellation. Typical automotive applications include hands-free sets, acoustic crash sensors and active noise cancellation.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfill the functions of several units recited in the claims. Any reference signs in the claims shall not be construed so as to limit their scope.

The invention claimed is:

1. A package for a MEMS transducer comprising:
a first member;
a second member provided in a plane overlying the first member;
a chamber provided between the first and second members;
a third member interposed between the first and second members, wherein the third member comprises a cavity which extends through the plane of the third member and forms part of the chamber,
wherein an integrated circuit is provided within the chamber of the package and is mounted on the first member, an electrically conductive path being provided directly between the integrated circuit and an electrical contact provided on an upper region of the third member,
and wherein the package comprises a metallic lid structure between the first member and the third member, the lid structure comprising side portions and an upper surface portion, the side portions are mounted to the first member and the upper surface portion forms a layer of the third member, the upper surface portion comprising a lid-cavity which forms at least part of the cavity of the third member.

2. A package as claimed in claim 1, wherein the electrically conductive path is provided by wire bonding between the integrated circuit and the electrical contact.

3. A package as claimed in claim 1, wherein the third member at least partially forms a side-wall of the package.

4. A package as claimed in claim 3, wherein the package comprises a side-wall recess formed between the first member and the third member.

5. A package as claimed in claim 4, wherein at least a part of the integrated circuit is provided within the side wall recess.

6. A package as claimed in claim 1, wherein one or more of the first member, the second member and the third member comprise a core of one or more of PCB, FR-4 board, silicon or plastic.

7. A package as claimed in claim 6, wherein one or more of the first member, the second member and the third member further comprises one or more additional layers provided on an upper and/or lower surface of the core.

8. A package as claimed in claim 7, wherein one of the additional layers comprises an insulating layer or a solder mask layer.

9. A package as claimed in claim 7, wherein the first member comprises a core and an additional layer provided on a first region of the upper surface of the core, wherein the additional layer is not provided on a second region of the upper surface of the first member and wherein the integrated circuit is mounted to the first member in the second region and is mounted directly on the core of the first member.

10. A package as claimed in claim 7, wherein the third member comprises a core and an additional layer provided on a first region of a lower surface of the core wherein said additional layer is not provided on a second region of the lower surface thereof, which second region is in a plane below the electrical contact.

11. A package as claimed in claim 1, wherein the second member is provided with an external electrical contact on an outer surface thereof.

12. A package as claimed in claim 1, wherein the second member is provided with a via for electrically coupling the electrical contact provided on the upper region of the third member and the external electrical contact of the package.

13. A package as claimed in claim 1, wherein the first and third members and/or the third and second members are bonded together by means of solder bonds.

14. A package as claimed in claim 1, further comprising a MEMS transducer provided within the chamber said MEMS transducer comprising a flexible membrane and being provided such that the flexible membrane overlies a sound port of the first member.

15. A package as claimed in claim 14, wherein the sound port couples to a first volume provided beneath the flexible membrane and wherein a second volume is defined on the other side of the flexible membrane.

16. An electronic device comprising a package as claimed in claim 1, wherein said electronic device is at least one of: a portable device; a battery power device; a computing device; a communications device; a gaming device; a mobile telephone; an earphone or in-ear hearing aid, a personal media player; a laptop, tablet or notebook computing device.

17. A package for a MEMS transducer comprising:
a first member;
a second member provided in a plane overlying the first member;
a chamber provided between the first and second members;
a third member interposed between the first and second members, the third member at least partially forming a side-wall of the package, wherein the third member comprises an intermediate cavity which extends through the plane of the third member and forms part of the chamber,
wherein an integrated circuit is provided within the chamber and is mounted on the first member, wherein the package comprises a side-wall recess formed between the first member and the third member and an integrated circuit, and wherein at least a part of the integrated circuit is provided within the side-wall recess,
and wherein the package comprises a metallic lid structure between the first member and the third member, the lid structure comprising side portions and an upper surface portion, the side portions are mounted to the first member and the upper surface portion forms a layer of the third member, the upper surface portion comprising a lid-cavity which forms at least part of the intermediate cavity of the third member.

18. A package as claimed in claim 17, wherein an electrically conductive path is provided directly between the integrated circuit and an electrical contact provided on an upper region of the third member.

19. A package as claimed in claim 18, wherein the electrically conductive path is provided by wire bonding between the integrated circuit and the electrical contact.

20. A package as claimed in claim 19, wherein no electrically conductive path is provided between the integrated circuit and an external electrical contact through the third member that forms the side wall.

* * * * *

UNITED STATES PATENT AND TRADEMARK OFFICE
CERTIFICATE OF CORRECTION

PATENT NO. : 10,252,906 B2
APPLICATION NO. : 15/788499
DATED : April 9, 2019
INVENTOR(S) : Roberto Brioschi, David Patten and Rkia Achehboune It is certified that error appears in the above-identified patent and that said Letters Patent is hereby corrected as shown below:

In the Specification

In Column 1, Line 58, delete "one of more" and insert -- one or more --, therefor.

In Column 3, Line 19, delete "solder bond 110v" and insert -- solder bond 110va --, therefor.

In Column 4, Line 32, delete "solder bond 110v" and insert -- solder bond 110va --, therefor.

In Column 4, Line 33, delete "109s." and insert -- 109a. --, therefor.

In Column 4, Lines 55-56, delete "for the for the" and insert -- for the --, therefor.

In Column 6, Line 27, delete "and or" and insert -- and/or --, therefor.

In Column 7, Line 13, delete "illustrate s" and insert -- illustrates --, therefor.

In Column 7, Line 14, delete "design" and insert -- design; --, therefor.

In Column 7, Line 15, delete "illustrate s" and insert -- illustrates --, therefor.

In Column 7, Line 17, delete "illustrate s" and insert -- illustrates --, therefor.

In Column 7, Line 19, delete "illustrate s" and insert -- illustrates --, therefor.

In Column 7, Line 22, delete "illustrate s" and insert -- illustrates --, therefor.

In Column 7, Line 25, delete "illustrates s" and insert -- illustrates --, therefor.

In Column 8, Line 33, delete "first member 101" and insert -- first member 201 --, therefor.

Signed and Sealed this
Tenth Day of September, 2019

Andrei Iancu
*Director of the United States Patent and Trademark Office*

CERTIFICATE OF CORRECTION (continued)
U.S. Pat. No. 10,252,906 B2

In Column 11, Line 32, delete "an may" and insert -- and may --, therefor.

In Column 11, Line 48, delete "also intended" and insert -- also intended to --, therefor.

In the Claims

In Column 14, Line 31, Please amend Claim 20 as follows:
20. A package as claimed in claim 19, wherein no electrically conductive path is provided between the integrated circuit and the external electrical contact through the inside of the third member that forms the side wall.